United States Patent [19]

Slob

[11] Patent Number: 4,987,558
[45] Date of Patent: Jan. 22, 1991

[54] SEMICONDUCTOR MEMORY WITH VOLTAGE STABILIZATION

[75] Inventor: Arie Slob, Eindhoven, Netherlands

[73] Assignee: U.S. Philips Corp., New York, N.Y.

[21] Appl. No.: 332,686

[22] Filed: Mar. 31, 1989

[30] Foreign Application Priority Data

Apr. 5, 1988 [NL] Netherlands ..................... 8800851

[51] Int. Cl.⁵ .................. G11C 19/28; H03K 23/46
[52] U.S. Cl. ..................................... 365/183; 377/57; 377/63
[58] Field of Search ............................. 365/183, 149; 307/296.6; 323/313; 377/63

[56] References Cited

U.S. PATENT DOCUMENTS

| | | | |
|---|---|---|---|
| 3,831,041 | 8/1974 | Krambeck et al. | 365/183 |
| 4,011,471 | 3/1977 | Rockett, Jr. | 323/313 |
| 4,118,795 | 10/1978 | Frye et al. | 365/183 |
| 4,156,818 | 5/1979 | Collins et al. | 377/63 |
| 4,159,430 | 6/1979 | Boudewijn et al. | 377/63 |
| 4,317,054 | 2/1982 | Caruso et al. | 307/355 X |
| 4,325,018 | 4/1982 | Schade, Jr. | 323/313 |
| 4,357,571 | 11/1982 | Roessler | 323/313 |
| 4,375,596 | 3/1983 | Hoshi | 323/313 |
| 4,451,744 | 5/1984 | Adam | 323/313 |
| 4,454,467 | 6/1984 | Sakaguchi | 323/313 |
| 4,574,384 | 3/1986 | Murata et al. | 377/63 |
| 4,627,082 | 12/1986 | Pelgrom et al. | 377/63 |
| 4,644,257 | 2/1987 | Böhme et al. | 323/313 |

Primary Examiner—Terrell W. Fears
Assistant Examiner—Michael A. Whitfield
Attorney, Agent, or Firm—Steven R. Biren

[57] ABSTRACT

In dynamic memories, generally a fluctuation of 10% of the nominal value of the supply voltage is allowed. Since, when reading, the input gate is applied to the supply, this fluctuation in the supply results in 20% of fluctuation in the charge packet formed below the input gate. In order to eliminate this fluctuation and hence to increase the permitted interference margin for other interference sources, a voltage stabilization circuit is arranged between the supply voltage and the input gate so that the fluctuation in the supply also occurs at the source zone, as a result of which the size of the charge packet becomes independent of the supply. For the voltage stabilization circuit, use may advantageously be made of a band gap reference.

7 Claims, 3 Drawing Sheets

SEMICONDUCTOR MEMORY WITH VOLTAGE STABILIZATION

BACKGROUND OF THE INVENTION

The invention relates to a semiconductor memory device comprising a source zone located at a surface of a semiconductor body, a memory gate located beside the source zone and insulated from the surface, by means of which a potential well can be induced in the semiconductor body, in which well an information-representing charge packet in the form of a quantity of charge carriers supplied by the source zone can be stored, and a switching gate located between the source zone and the memory gate and insulated from the surface, by means of which the connection between the source zone and the potential well can be closed or interrupted. Such a semiconductor memory device may be, for example, a charge transfer device, such as a CCD or a BBD, whose input stage is constituted by the said source zone, the said switching gate and the said memory gate. When a positive voltage is applied to the memory gate (in the case of an n-channel CTD), a potential well is generated in the subjacent part of the channel. When a positive voltage is also applied to the switching gate, the channel below the switching gate becomes conducting, as a result of which electrons can flow from the n-type source zone (in the case of an n-channel CTD) into the potential well below the memory gate. When the voltage at the switching gate is reduced, the connection between the source zone and the charge below the switching gate is interrupted, as a result of which an insulated charge packet is formed below the memory gate, which represents, for example, a "1" in the case of digital signals. This input method, designated as "diode cut-off method", is described inter alia in the book "Charge Coupled Devices and Systems" by Howes and Morgan, ed Wiley and Sons, 1980, pp. 111-115.

As is well known, a signal which is introduced into the memory can be distorted by all kinds of interference influences, as a result of which the signals arriving at the output will deviate more or less from the nominal values "1" and "0". During the detection, in general the value "½" halfway between the "1" level and the "0" level is used as a reference. If the signal lies above ½, it is considered as a "1", whereas if it lies below ½, it is considered as a "0". This means that the interference margin (i.e. the maximum permissible interference with which the signal can still be correctly detected) is half or 50% of the distance between the nominal "1" and "0".

For forming the potential well below the memory gate, it is common practice to apply to the memory gate a voltage of +5 V, which can be directly derived from the supply source. As will be explained more fully hereinafter, the fluctuations in the supply voltage in combination with the input method described above can give rise to problems.

The permissible fluctuations in the supply voltage are normally about 10%, that is to say that the clock voltage applied is not always exactly 5 V, but may vary between 5.5 V and 4.5 V. This variation also occurs with the clock voltage applied to the clock electrodes during the transport of the charge packet. The consequence of the fluctuation of the voltage at the memory gate at the input will be that the size of the charge packet will also vary. Since overflow of the charge from one packet (bit) to another bit will lead to disturbing errors, the filling level below the said memory gate must be such that, when this well is filled at the maximum supply voltage, overflow does not yet occur even at the minimum supply voltage. This can be achieved in that the potential well is filled up to 80% of the supply voltage. At a supply voltage of 5.5 V, the potential well is then filled up to a level of 4.4 V. At a supply voltage of 4.5 V, the well is filled, however, only up to a level of 3.6 V. This means that the fluctuation in the supply voltage in this input method also gives rise to a fluctuation of about 10% in the size of the charge packet, which corresponds to an interference of 20%. Therefore, 20% of the permissible interference margin of 50% is used by the fluctuations of the supply voltage. Since other interference sources exist in addition to the supply voltage fluctuations, such as leakage current, incomplete charge transport, capacitive crosstalk between the electrodes, and output amplifier interference, it is desirable to reduce the influence of the interferences in the supply voltage.

An analogous problem may also arise in other memories, for example, in 1 MOS bit dynamic memories. In these memories, each memory cell consists of a capacitor, in which information is stored in the form of charge, and of an insulated gate field effect transistor. The capacitor, or at least the information-containing plate of the capacitor, is connected to the source or the drain of the transistor. The other main electrode of the transistor is connected to a bit line, through which information is written or read. The gate electrode of the transistor is connected to a word line. Just like in a CCD, the memory capacitor comprises a gate electrode, which is insulated from the surface of the semiconductor body by a thin dielectric and by means of which a potential well is induced in the semiconductor body, in which well a charge packet is stored as information. In order to keep the surface area of the chip as small as possible, the memory capacitors are made as small as possible. Since consequently the storage capacity becomes very small, also with these devices it is of great importance to make the influence of the interferences in the supply voltage applied to the memory gate as small as possible.

SUMMARY OF THE INVENTION

The invention is based inter alia on the recognition of the fact that the influence of fluctuation in the supply voltage on the size of the charge packet to be formed can be practically entirely eliminated by applying to the source zone a voltage with the same fluctuations.

Therefore, according to the invention a semiconductor memory device of the kind described above is characterized in that between the memory gate and the said source zone voltage stabilization means are present, with the aid of which such a voltage can be applied to the source zone during the introduction of charge carriers into the said potential well that the potential difference between the memory gate and the source zone and hence the size of the said charge packet are at least practically entirely independent of voltage fluctuations at the memory gate.

By the said voltage stabilization means, it is achieved that fluctuations in the supply voltage influencing the depth of the potential well below the memory gate vary the potential of the source zone in the same or at least practically the same manner, as a result of which the size of the charge packet to be formed is independent or at least practically independent of these fluctuations. As a result, in a comparatively simple manner a large interference source can be eliminated, as a result of which the interference margin for other interference sources can become larger.

BRIEF DESCRIPTION OF THE DRAWING

The invention will be described more fully with reference to several embodiments and the accompanying diagrammatic drawing, in which.

DESCRIPTION OF THE PREFERRED EMBODIMENTS

Figure 1:
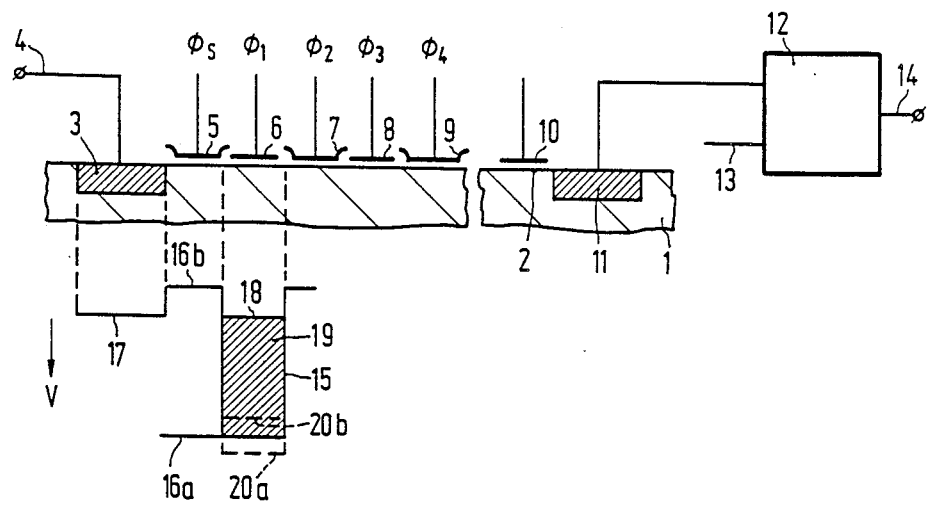
FIG. 1 shows diagrammatically a charge-coupled device having a conventional input stage.

In order to illustrate the effect of the invention, FIG. 1 shows diagrammatically a CCD having a conventional input stage. The device comprises a silicon substrate having a p-type region 1 adjoining the surface 2. The input stage comprises an n-type surface zone 3 provided with a connection 4 for applying voltages. Besides the zone 3, a series of electrodes 5-9 is arranged, which are insulated from the surface 2 by a thin dielectric layer not shown. The electrode 6, designated hereinafter as memory gate, is the gate below which an information-representing charge packet is formed. The electrode 5 with clock $\phi_s$ between the zone 3 and the memory gate 6 constitutes a circuit by means of which the connection between the zone 3 and the memory region below the gate 6 can be closed or interrupted. The zone 3 and the electrodes 5,6 together constitue the input stage of the charge-coupled device. Only an adjoining part of the charge transport channel with the electrodes 7,8 and 9 is shown. The device constitutes, by way of example, a 4-phase system with the clock voltages $\phi_1$, $\phi_2$, $\phi_3$ and $\phi_4$, the clock $\phi$ also being applied for the sake of simplicity to the gate 6. In the drawing, the output is also shown diagrammatically with an output gate 10, which is applied to a direct voltage, and an adjoining n-type output zone 11. The zone 11 is connected to one of the inputs of the differential amplifier 12, which is shown in the Figure only diagrammatically by a block. A reference signal is applied to the input 13 of the amplifier 12 and the output signal derived from the zone 11 is compared with this reference signal. The read-out signal can be derived at the output 14 of the amplifier 12.

The clock voltages $\phi_s$ and $\phi_1$, $\phi_2$, $\phi_3$ and $\phi_4$ are derived directly from the supply voltage and vary, for example, between 0 V and +5 V. The gate 10 is applied to a suitably chosen level between 0 V and 5 V, for example 1.5 V.

For illustrating the problems which may arise when filling according to a conventional "diode cut-off" method, FIG. 1 shows the potential variation in the input stage during the formation of a charge packet (logic "1"). The (positive) potential is plotted in downward direction. If a voltage which is exactly 5 V is applied to the memory gate 6, a potential well, whose depth is indicated by a full line, is induced below the gate 6. The potential level below the switching gate is indicated by the line 16a at a voltage of 5 V and by the level 16b at a reverse voltage of 0 V. By choosing a suitable value for the voltage applied to the zone 3, the potential level of the zone 3 is adjusted to the reference level 17. If now the voltage of 5 V is applied to the gate 5, charge (indicated in the drawing by the shaded area) can flow from the source zone 3 into the potential well 15. The potential level 18 up to which the well 15 is filled is determined by the level 17 and is therefore fixed at a fixed reference voltage at the zone 3. By reduction of the voltage at the gate 5, the potential level below the switching gate 5 passes to the level 16b, as a result of which an insulated charge packet 19 having the size Q0 is formed below the electrode 6. Due to fluctuations in the voltage at the electrode 6, the size of the charge packet 19 also fluctuates. If the voltage applied is not 5 V, but 5.5 V, the level of the (empty) potential well 15 will fall to the level 20a. At a fixed filling level 18, this means an increase of the charge packet by about 10%. The size of the charge packet now becomes Qo+ΔQ, where ΔQ is about 0.1 Qo. If the voltage applied is 4.5 V instead of the nominal voltage of 5 V, the bottom of the (empty) potential well 15 rises to the level 20b. The potential well then becomes less deep and can therefore contain less charge. In order to avoid that overflow of charge from one bit to another bit occurs in the period between writing and reading, the reference level 17 will be chosen so that the largest charge packet (clock voltage 5.5 V) fits into a shallow potential well (clock voltage 4.5 V). This can be achieved in that the potential well is not filled completely, but is filled, for example, only up to 80%, by choosing the level 17 to be sufficiently low. In this manner, overflow of charge can be completely avoided. However, this method has the disadvantage that the fluctuation of the supply voltage still causes an interference of about 20% in the size of the charge packet, which, in view of the overall interference margin and other interference sources, is very high.

Figure 2A:
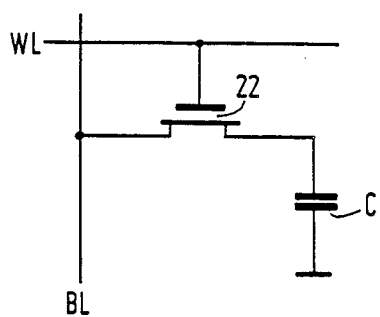
FIG. 2 shows the equivalent circuit diagram and a cross-section of a convential dynamic memory cell.
Figure 2B:
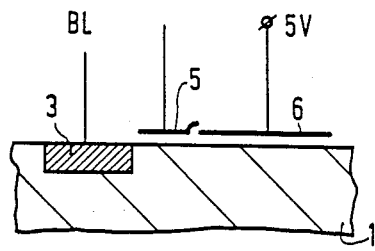

A similar problem arises, as already stated above, in omnilaterally accessible memories or 1MOST/bit memories. FIG. 2a shows in simplified schematic form the circuit diagram of a 1 MOST/BIT memory cell. The information is stored in the memory capacitance C and is supplied or read via the bit line BL. The cell is selected by means of the MOS transistor 22, whose gate is connected to the word line WL. FIG. 2b shows diagrammatically a cross-section of a part of a possible embodiment of this cell. The semiconductor body 1 again comprises a p-type region 1 provided with an n-type surface zone 3, which is connected to the bit line BL. The memory capacitance C is constituted by the gate electrode of memory gate 6 and the underlying surface region of the body 1, which is separated by a thin oxide layer from the gate 6. During operation, the supply voltage of 5 V is applied to the gate 6, as a result of which a potential well is induced in the semiconductor body. This potential well 15 is shown in FIG. 2 below the semiconductor body 1. The depth of the well fluctuates with the supply voltage, which is indicated by the broken lines. For writing, the voltage of 5 V is also applied to the gate 5 between the zone 3 and the memory gate 6. The signal to be written is applied via the bit line BL to the zone 3. For writing a logic "1", the voltage level of the zone 3 is again chosen so that a charge packet, which is formed when the supply voltage is 5.5 V, will not overflow when the voltage at the gate 6 then falls to 4.5 V. With such a choice of the voltage applied to the zone 3, the size of the charge packet will still strongly vary with the supply voltage, which has similar disadvantages as described above for CCD's.

Figure 3:
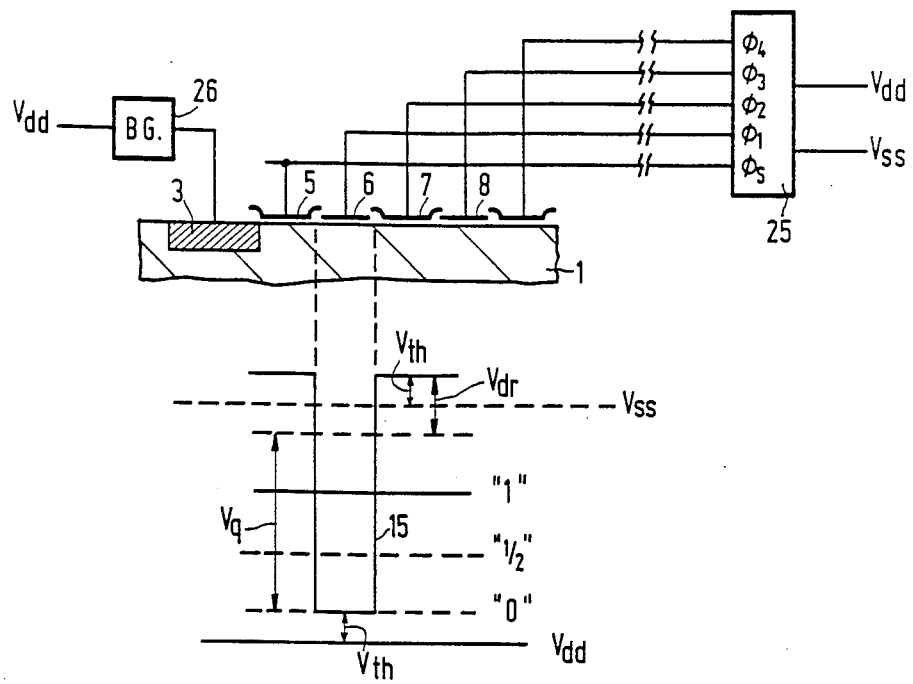
FIG. 3 shows a charge-coupled device according to the invention.

FIG. 3 shows diagrammatically a charge-coupled device according to the invention, in which this disadvantage is obviated at least to a considerable extent. In the drawing, which only shows the input part, the same reference numerals as in FIG. 1 are used for corresponding components. To the clock electrodes 5,6,7,8 etc. are applied clock voltages $\phi_s$, $\phi_1$, $\phi_2$, $\phi_3$, $\phi_4$, which are supplied by the clock voltage source 25 and which vary between $V_{ss}$ (for example 0 V or ground) and the power supply voltage $V_{dd}$ (nominal value, for example, 5 V). To the input diode 3 is applied a voltage $V_d$, which is derived via a reference voltage source 26 from $V_{dd}$. The voltage $V_d$ is such that the difference $V_{dd}-V_d$ is at least practically independent of fluctuations at $V_{dd}$, that is to say that $V_d$ is subjected to at least practically the same fluctuations as $V_{dd}$, as a result of which the quantity of charge stored below the gate 6 is practically independent of the fluctuations at $V_{dd}$.

The reference voltage source 26 is constituted by a so-called band gap reference, which is well known in the literature and is frequently used in cases in which a low temperature coefficient is desired. Before the specific construction of the band gap reference 26 is described, there will first be determined with reference to the potential diagram shown in FIG. 3 what is the desired value of this voltage. Reference numeral 15 again designates the potential well below the gate 6. The level $V_{ss}$ represents the ground potential. The surface potential below the gates 5 and 7 which are applied to ground is lower by $V_{th}$ than the ground potential. The drawing also shows the potential level $V_{dd}$. The surface potential below the gate 6 is lower by $V_{th}$ than the level $V_{dd}$. It is assumed that the threshold voltages below the gates 5,6,7 and 8 have equal values. In order to avoid that during transport overflow of charge occurs, the adjustment is chosen so that the maximum filling level $V_q$ remains a value $V_{dr}=1.2$ V below $V_{th}$. If for the lowest value of $V_{dd}$ the value of 4.5 V is assumed, this means that $V_q=4.5-1.2=3.3$ V. It is necessary that this value can contain the signal charge and charge originating from other sources (thermal generation, transfer inefficiency). A suitable choice for the voltage $V_d$ is such that the margins "0"—"½" and "½"—"1" and "1"—$V_{dr}$ are equal to each other, i.e. 3.3/3=1.1 V. The value "1" then comes to lie at 2.2, V. The band gap reference 26 then must generate (with respect to $V_{dd}=5$ V) a voltage of 2.8 V.

Figure 4:
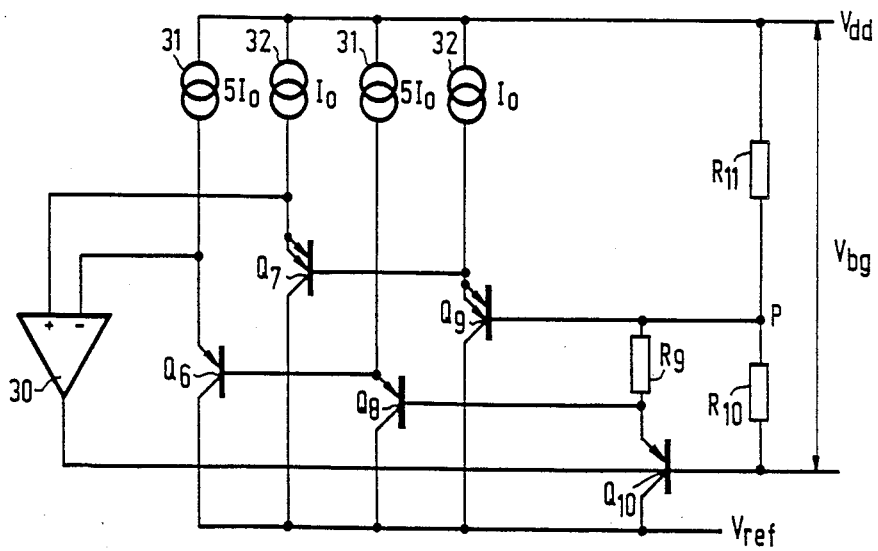
FIG. 4 shows the electric circuit diagram of the band gap reference voltage source used in the device shown in FIG. 3.

For the band gap reference source 26, several constructions known from the literature may be used. FIG. 4 shows an embodiment which is described in Phillips Netherlands Patent Application entitled "Band gap reference circuit", which was filed on 19 Feb. 1988 under Application No. 8800422 and whose contents as contained in corresponding U.S. Pat. No. 4,897,595, are incorporated by reference in the present Application. The circuit comprises an operational differential amplifier 30, whose output is fed back through the transistor Q10 and through two cascade circuits comprising Q7 and Q9 and Q6 and Q8, respectively, to the two inputs. The positive input + is connected to the emitter of the transistor Q7, while the negative input − of the amplifier 30 is connected to the emitter of the transistor Q6. The base of Q7 is connected to the emitter of Q9 and the base of Q6 is connected to the emitter of the transistor Q8. The base of the transistor Q9 is connected to the junction point P of the voltage divider $R_{10}$–$R_{11}$ and through the resistor R9 to the emitter of the transistor Q10 and the base of the transistor Q8. The emitters of the transistors Q6 and Q8 are each connected to a current source 31, which supplies a current 5 Io; the emitters of the transistors Q7 and Q9 are each connected to the current source 32, which supplies a current Io. The collectors of the transistors are connected to the substrate, which is in turn connected, for example, to ground. The operation of the circuit shown in FIG. 4 is briefly as follows. The operational amplifier 30 supplies such an output signal that the voltage between the input terminals is practically 0 V, that is to say that the emitters of Q6 and Q7 practically have the same potential. For calculating the voltage at the base zones, there is started from the diode equation:

$$J = A_e J_s \exp \cdot V_{BE}/V_T \quad (1)$$

with $A_e$=emitter surface,
$J_s$=saturation current,
$V_{BE}$=base-emitter voltage,
$V_T=KT/q$, where K is the Boltzmann constant, T is the absolute temperature and q is the electron charge. In case $A_e$ for Q7 is $9 \times A_e$ of Q6 and the current through Q6 is $5 \times$ the current through Q7, it follows from the equation (1) for the voltage difference between the bases of Q7 and Q6:

$$dV_B = V_T \ln 45 \quad (2)$$

If now j pairs of transistors Q6–Q7, Q8–Q9 are connected in cascade, a voltage $j \cdot dV_B = jV_T$ occurs across the resistor R9.

The voltage across R10 then becomes $V_{BE10}+jV_T \ln 45$, where $V_{BE10}$ is the voltage across the base-emitter junction of Q10.

For the output voltage $V_{bg}$ there can be written:
$V_{bg}=(V_{BE10}+jV_T \ln 45)(1+R11/R10)+(jV_T \ln 45)R11/R9$.

If also the offset voltage $V_{os}$ of the differential amplifier 30 is taken into account, $V_{bg}$ becomes$=(-V_{BE10}+jV_T \ln 45+V_{os})(1+R11/R10)+(jV_T \ln 45+V_{os})R11/R9$.

This can be written as:

$$V_{bg}=g \cdot (V_{BE10}+n \cdot jV_T \ln 45 + nV_{os}) \quad (3)$$

with $$g=1+R11/R10 \quad (3a)$$

$$n=1+R11/gR9 \quad (3b)$$

In a practical embodiment, j was chosen to be equal to 2. With the ratio R11/R10, for $V_{bg}$ each value above a minimum value of 1.28 V can be obtained and therefore also the desired value of 2.8 V. The circuit can then be designed so that the temperature coefficient for $V_{bg}$ is equal or at least substantially equal to zero. This possibility is apparent from the equation (3), in which the first term ($V_{BE10}$) has a negative temperature coefficient and the second term ($V_T = KT/q$) has a positive temperature coefficient.

The circuit shown in FIG. 4 may be constructed together with the charge-coupled device according to CMOS technology or a combined bipolar CMOS technology. The differential amplifier 30 and the current sources 31, 32 may be constituted by MOS transistors. The bipolar pnp transistors Qi may be constituted by vertical transistors arranged in an N well, the p-type substrate constituting a common collector.

It will appear from the description with reference to FIG. 3 that with a given choice of the voltage at the diode 3, the size of the charge packet will still depend upon the threshold voltage $V_{th}$. In general, with an increasing $V_{th}$, the charge packet will become smaller. In the case in which, for example, a very high accuracy is desired, fluctuations in $V_{th}$ may also advantageously be combined. This may be achieved in that the $V_{th}$ is added to the band gap voltage $V_{bg}$, for example by means of a source follower. As a result, however, again a temperature-dependent component would be introduced into the reference voltage.

Another solution is described with reference to the circuit diagram shown in FIG. 5. The output of the band gap reference voltage source of FIG. 4 is connected to a voltage divider 8R-R-4R, which divides the voltage $V_{BG}$ into units 1/13 $V_{BG}$. The junction point between 4R and R is connected to the gate electrode of the n-channel MOST N1. The junction point between 8R and R is connected to the gate electrode of the n-channel MOST N2. The transistors N1 and N2 are connected to current sources in such a manner that a 4 times larger current flows through N2 than through N1. The output voltage is derived at the output terminal 37. The transistors N1,N2 are assumed to have the same threshold voltage $V_{th}$ as the charge-coupled device.

Figure 5:
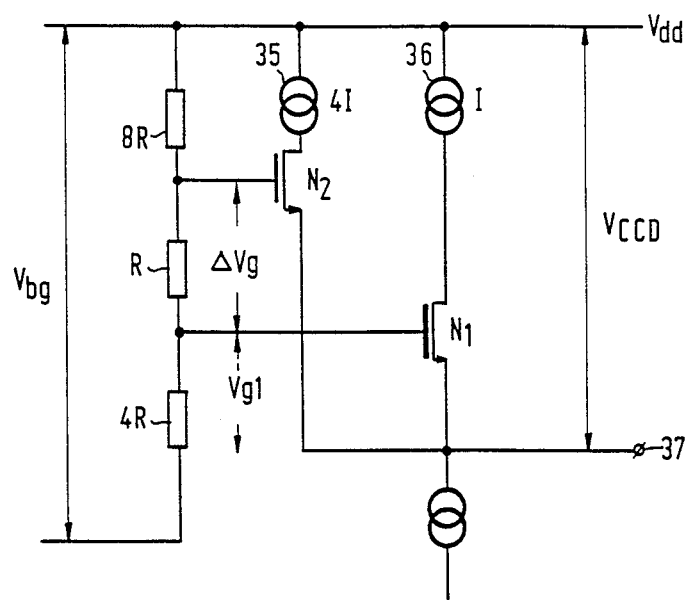
FIG. 5 shows the circuit diagram of a circuit intended to increase the reference voltage of FIG. 4 by the threshold voltage $V_{th}$.

For the description of the operation of the circuit shown in FIG. 5, it is assumed that N1 and N2 both operate in the saturation range, for which it holds that:

$$I_D = B_N/2(V_g - V_{th})^2 \quad (4),$$

where $B_N$ is the amplification factor, $I_d$ is the drain current and $V_g$ is the gate voltage. For the ratio between N1 and N2 it holds that:

$$\frac{I_{D2}}{I_{D1}} = \frac{(V_{g1} + \Delta V_g - V_{th})^2}{(V_{g1} - V_{th})^2} \quad (5)$$

For the gate voltage $V_{g1}$ at N1 it holds that:

$$V_{g1} = V_{CCD} - \frac{9}{13} V_{bg} \quad (6)$$

It further holds that:

$$V_g = \frac{1}{13} V_{bg} \quad (7)$$

It can be calculated from the equations 4–9, taking into account that the currents through the transistors N1 and N2 have a ratio of 1:4, that $$V_{CCD} = \frac{10}{13} V_{bg} + V_{th} \quad (8)$$

The voltage applied to the diode 3 is then:

$$V_{DD} - \frac{10}{13} V_{bg} - V_{th}$$

This voltage therefore fluctuates both with $V_{DD}$ (in positive direction) and with the threshold voltage $V_{th}$ (in negative direction), as a result of which the charge packet formed below the gate 6 is practically independent of fluctuations of the supply voltage and of the threshold voltage.

Figure 6:
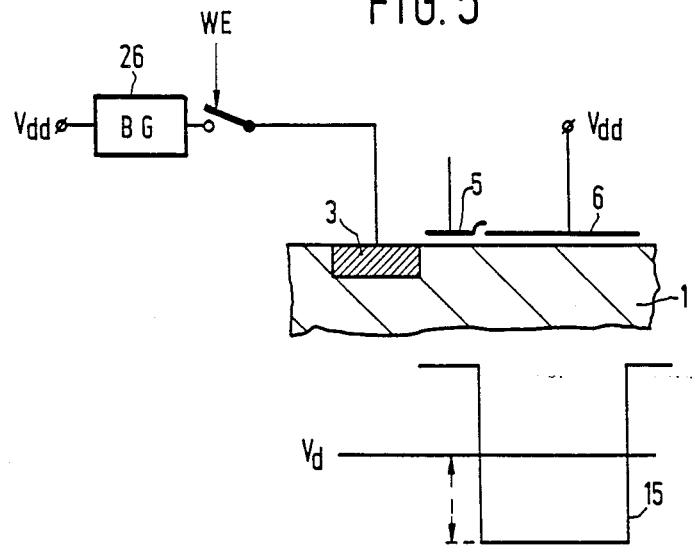
FIG. 6 shows a dynamic memory cell according to the invention.

The principle described here for CCD's may also advantageously be used in a so-called 1 MOST'BIT memory or DRAM, as shown diagrammatically in FIG. 6. The supply voltage $V_{dd} = 5$ V is applied to the memory gate 6, as a result of which the potential well 15 is induced in the semiconductor body. During writing, the input diode 3 may be connected, for example, by means of the "write enable" signal to the reference voltage source 26, which supplies a fixed reference voltage with respect to $V_{dd}$.

The voltage level $V_d$ is such that, when writing a logic "1", the quantity of charge in the well 15 is again independent of fluctuations in the supply. For the value of the "1" signal, similar considerations as described here for CCD's may be applied.

It will be appreciated that the invention is not limited to the embodiment described here, but that many further variations are possible for those skilled in the art within the scope of the invention. For example, the invention may also be used in buried channel CCD'S or in bucket brigades (BBD's). Instead of the reference sources described here, other reference voltage sources may also be used.

I claim:

1. A semiconductor memory device comprising a source zone located at a surface of a semiconductor body, a memory gate located beside the source zone and insulated from the surface, by means of which a potential well can be induced in the semiconductor body, in which potential well an information-representing charge packet in the form of a quantity of charge carriers supplied by the source zone can be stored, a power supply terminal for receiving a power supply voltage during operation, and a switching gate located between the source zone and the memory gate and insulated from the surface, by means of which the connection between the source zone and the potential well can be closed or interrupted, characterized in that voltage stabilization means are provided between said power supply terminal and said source zone to provide a voltage to the source zone during the introduction of charge carriers into said potential well in operation such that the potential difference between the potential at the memory gate and the potential at the source zone and the size of said charge packet are at least substantially entirely independent of voltage fluctuations at the memory gate resulting from fluctuations in said power supply voltage.

2. A semiconductor memory device as claimed in claim 1, characterized in that the source zone, the switching gate and the memory gate comprise the input stage of a charge-coupled device, further comprising a transport channel, through which the introduced information can be transported to an output under the influence of clock voltages applied to a row of clock electrodes which are arranged above the transport channel.

3. A semiconductor memory device as claimed in claim 2, characterized in that the switching gate is connected to a signal source, by which either a first voltage level is applied to the switching gate, at which upon introduction of information charge can flow from the source zone into the potential well below the switching gate, or a second voltage level is applied to the switching gate, at which the supply of charge to this potential well is entirely blocked.

4. A semiconductor memory device as claimed in claim 2 or 3, characterized in that means are provided to also apply said clock voltage levels applied to the row of clock electrodes to the switching gate.

5. A semiconductor memory device as claimed in claim 1, characterized in that the source zone, the switching gate and the memory gate form part of a 1 MOST/BIT dynamic memory cell comprising an insulated gate field effect transistor, one of the main electrode regions of which comprises said source zone, which source zone is connected to a bit line, while the other main electrode region is connected to the surface region below the memory transistor and the gate electrode is connected to a word line.

6. A semiconductor memory device as claimed in claim 1, 2 or 3, characterized in that said voltage stabilization means comprises a band gap reference voltage circuit, which generates a fixed voltage with respect to the voltage applied to the memory gate.

7. A semiconductor memory device as claimed in claim 6, characterized in that further means are provided, with the aid of which the threshold voltage of the memory gate is added to the voltage generated by the band gap reference voltage circuit.

* * * * *